United States Patent [19]
Westerwick

[11] Patent Number: 5,635,860
[45] Date of Patent: Jun. 3, 1997

[54] OVERVOLTAGE-TOLERANT SELF-BIASING CMOS OUTPUT BUFFER

[75] Inventor: Eric H. Westerwick, Aberdeen, N.J.

[73] Assignee: Lucent Technologies Inc., Murray Hill, N.J.

[21] Appl. No.: 580,413

[22] Filed: Dec. 28, 1995

[51] Int. Cl.⁶ ............................................. H03K 19/003
[52] U.S. Cl. ..................................... 326/81; 326/34
[58] Field of Search ................................. 326/21, 31, 34, 326/80, 81, 121

[56] References Cited

U.S. PATENT DOCUMENTS

| | | | |
|---|---|---|---|
| 4,616,143 | 10/1986 | Miyamoto | 326/38 X |
| 5,406,140 | 4/1995 | Wert et al. | 326/81 X |
| 5,444,397 | 8/1995 | Wong et al. | 326/81 |
| 5,467,031 | 11/1995 | Nguyen et al. | 326/81 |
| 5,493,233 | 2/1996 | Shigehara et al. | 326/121 X |

OTHER PUBLICATIONS

Brian C. Martin, *Tips for Straddling the 3–V to 5–V Fence*, Electronic Design, Apr. 4, 1994, pp. 67–72.
Marcel J. M. Pelgrom and E. Carel Dijkmans, *A 3/5 V Compatible I/O Buffer*, IEEE Journal of Solid–State Circuits, vol. 30, No. 7, Jul. 1995, pp. 823–825.

Primary Examiner—David R. Hudspeth

[57] ABSTRACT

An overvoltage-tolerant self-biasing input/output buffer circuit having a p-channel field-effect transistor ("FET"), a first n-channel FET and a biasing circuit for biasing the body of the p-channel FET so as to prevent forward-biasing of the of the p-channel FET. The p-channel FET has a source connected to a first voltage, a gate connected to a first input, a drain connected to an output, and the body connected to a node. The first n-channel FET has a drain connected to the output, a gate connected to a second input, a body connected to a second voltage, and a source connected to the second voltage. The biasing circuit includes a second n-channel FET and a third n-channel FET. The second n-channel FET has a source and a gate connected to the first voltage, a drain connected to the node, and a body connected to the second voltage. The third n-channel FET has a drain connected to the node, a gate and a source connected to the output, and a body connected to the second voltage.

8 Claims, 2 Drawing Sheets

OVERVOLTAGE-TOLERANT SELF-BIASING CMOS OUTPUT BUFFER

BACKGROUND OF THE INVENTION

1. Field of the Invention

The invention relates to circuit design that is compatible with multiple voltages. More specifically, the invention relates to an overvoltage-tolerant self-biasing complimentary metal-oxide semiconductor ("CMOS") output buffer for use in mixed-voltage circuit designs.

2. Description of Related Art

In every integrated circuit ("I/C") chip, there is a section called the input/output ("I/O") which contains circuits that condition the signals traveling into and out of the chip. The I/O of the chip contains I/O buffers. The I/O buffers interface, or buffer, the relatively sensitive, low current, circuits in the chip to the relatively high current environment outside of the chip. The I/O buffers are connected between the core circuitry and the pads, where wires or other conductors connect the chip to the external circuitry.

FIG. 1 illustrates a simple CMOS output buffer circuit. The CMOS output buffer circuit includes a first input 105 (N3), a second input 115 (N4), a first voltage input 125, a second voltage input 135, a p-channel metal-oxide semiconductor field-effect transistor (MOSFET) ("pMOS") 100, an n-channel MOSFET ("nMOS") 110, a pad 120 and an output 145. In the enabled mode of operation, inputs 105 and 115 are tied together. When inputs 105 and 115 are high, the pMOS 100 is turned OFF, the nMOS 110 is turned ON, and, therefore, the output 145 is pulled down to the second voltage input 135, or VSS (approximately 0 V). Similarly, when inputs 105 and 115 are low, the pMOS 100 is turned ON, and the nMOS 110 is turned OFF, thereby pulling the output 145 up to the first voltage input 125, or VDD (approximately 2.5 V in this illustration). However, if the voltage at the pad 120 becomes higher than the voltage at the first voltage input 125 (i.e., higher than VDD), then the drain-body junction of the pMOS 100 would become forward-biased resulting in a current flowing from the pad 120 to the first voltage input 125. This current can quickly become large enough to disrupt the operation of the circuit, possibly resulting in permanent damage to the circuit.

To prevent the forward-biasing of the drain-body junction of the pMOS 100, the body must be biased at a potential equal to or greater than the anticipated pad overvoltage, instead of at the first voltage input 125, or VDD. In one conventional method, the bias voltage is obtained from an external voltage source, separate from VDD, that is higher than VDD. This method, however, has many disadvantages. First, an additional external voltage source is required. Next, an additional contact pad and associated metal conductors on and off the chip are required to deliver the bias voltage to the pMOS body. Moreover, the additional pad consumes chip real estate and the conductors add to routing complexity. Finally, the threshold voltage of the output buffer is increased even in the absence of an output pad overvoltage condition because the body of the pMOS device is biased at a fixed voltage that is higher than VDD. This unnecessarily degrades the normal performances of the output buffer.

In another conventional method, the bias voltage is generated on the chip. Although this method does not require an additional external voltage source or a contact pad, nevertheless increases the threshold voltage of the output buffer like the first conventional method described above. In addition, it requires an additional voltage generating circuit on the chip. This results in additional real estate and adds to the power consumed by the chip.

In both of these conventional methods, the maximum allowable pad overvoltage is set by the fixed voltage obtained from an additional external power supply or from an on-chip voltage generator. If the pad overvoltage exceeds the fixed bias voltage of either conventional methods, circuit damage may occur. In other words, the bias voltage is fixed and if the voltage at the pad 120 is higher than the fixed bias voltage, then the problem of forward-biasing arises again, which may damage the pMOS 100, and/or other devices.

In yet another conventional method, the pMOS body potential is derived directly from VDD or from the voltage on the output pad, whichever is greater. This is accomplished by fabricating Schottky-barrier diodes such that the anode of one diode is connected to VDD, the anode of a second diode is connected to the output pad, and the two cathodes are joined and connected to the pMOS body. When the voltage on the output pad is less than VDD, the first diode holds the pMOS body at a potential approximately equal to VDD, and the second diode is reverse-biased, preventing the VDD supply from affecting the output pad. When the voltage on the pad exceeds VDD, the second diode becomes forward-biased, transferring the overvoltage to the pMOS body. The first diode then becomes reverse-biased, preventing the overvoltage from disrupting the VDD supply.

Schottky-barrier diodes are composed of metal-semiconductor junctions. They are widely used in silicon bipolar I/Cs because the turn-on voltage of Schottky-barrier diodes is lower than that of silicon p-n junction diodes (~0.3 V compared to ~0.7 V). Also, less charge is stored in metal-semiconductor junctions than in p-n junctions which allows the metal-semiconductor junctions to turn ON and OFF more quickly. These two characteristics make Schottky-barrier diodes useful for circuit applications requiring fast switching.

The preferred material for fabricating Schottky-barrier diodes is PtSi. Pt, however, is infrequently used in conventional very large-scale integration ("VLSI") CMOS processing. Therefore, the addition of Schottky-barrier diodes into a conventional CMOS technology may require additional processing steps, which increases the processing cost and time, and may decrease the yield.

Thus, from the above discussion, it can be seen that it is desirable to have an overvoltage-tolerant output buffer design that does not require an additional voltage source, contact pad, or processing steps. Furthermore, it is desirable to have an overvoltage-tolerant output buffer design whose degree of overvoltage-tolerance is not limited by a predetermined potential, and whose normal performance is not effected by the circuitry that provides overvoltage-tolerance. Finally, it is desirable to have an overvoltage-tolerant output buffer whose real estate and power requirements are not significantly increased by the circuitry that provides overvoltage-tolerance. Moreover, such an overvoltage-tolerant output buffer design would be especially useful in mixed-voltage systems.

SUMMARY OF THE INVENTION

It is, therefore, an object of the invention to provide an overvoltage-tolerant output buffer design that does not require an additional voltage source, contact pad, or processing steps.

It is another object of the invention to provide an overvoltage-tolerant output buffer design whose degree of overvoltage-tolerance is not limited by a predetermined potential and whose normal performance is not effected by the circuitry that provides overvoltage-tolerance.

It is another object of the invention to provide an overvoltage-tolerant output buffer whose real estate and power requirements are not significantly increased by the circuitry that provides overvoltage-tolerance.

It is a further object of the invention to provide an overvoltage-tolerant output buffer design that would be especially useful in mixed-voltage systems.

Briefly, the invention is directed to an overvoltage-tolerant self-biasing CMOS output buffer circuit. The circuit has a p-channel field-effect transistor ("FET"), a first n-channel FET and a biasing circuit for biasing the body of the p-channel FET so as to prevent forward biasing of the drain-body junction of the p-channel FET. The p-channel FET has a source connected to a first voltage, a gate connected to a first input, a drain connected to an output, and the body connected to a node. The first n-channel FET has a drain connected to the output, a gate connected to a second input, a body connected to a second voltage, and a source connected to the second voltage. The biasing circuit includes a second n-channel FET and a third n-channel FET. The second n-channel FET has a source and a gate connected to the first voltage, a drain connected to the node, and a body connected to the second voltage. The third n-channel FET has a drain connected to the node, a gate and a source connected to the output, and a body connected to the second voltage.

Further features and advantages of the invention as well as the structure and operation of various embodiments of the invention are described in detail below with reference to the accompanying drawings. Like reference numbers indicate identical or functionally similar elements.

BRIEF DESCRIPTION OF THE DRAWINGS

The invention will be described with reference to the accompanying drawings where.

DETAILED DESCRIPTION OF THE PREFERRED EMBODIMENTS

Figure 1:
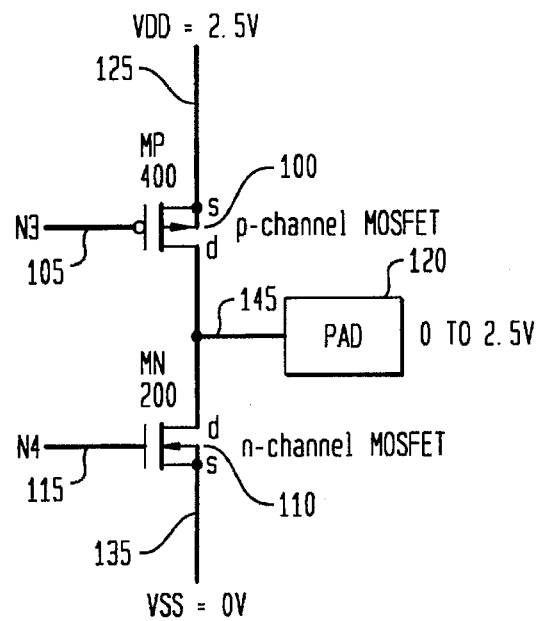
FIG. 1 is a circuit of a simple CMOS output buffer.

The invention is directed to an overvoltage-tolerant self-biasing CMOS output buffer that provides for an extended range of allowable overvoltages, that uses lower power circuits, that provides for simplified circuit and system designs, and/or that provides for simplified wafer processing when compared to conventional methods. In the traditional approaches, the maximum allowable pad overvoltage is set by the fixed voltage obtained from the additional power supply or from an on-chip voltage generator. If the pad overvoltage exceeds the fixed bias voltage, disruption of the circuit operation, and possible damage, will occur.

In the self-biasing approach of the invention, the maximum allowable pad overvoltage is more a function of the design of the buffer circuitry. Although one can always design a fixed-bias circuit with a voltage level higher than the highest anticipated pad overvoltage, the design of the self-biasing circuit is more practical. The self-biasing approach eliminates the need for off-chip bias voltage supplies or for on-chip bias voltage generators, both of which require power to operate. Compared to the conventional design using an additional off-chip bias voltage, the self-biasing approach of the invention eliminates the need for the additional voltage source as well as the circuit board wire, chip package pin, and the contact pad and metal conductors on the chip that are required to deliver the bias voltage to the I/O buffers. Compared to the conventional on-chip supply design, the self-biasing approach requires only two small-sized nMOS devices per pad, which are considerably smaller and less complicated than a ring oscillator and a charge pump bias voltage generator.

Another advantage of the invention is that it protects an output buffer from random spurious overvoltages. Although the conventional method of using Schottky-barrier diodes may protect an output buffer from random spurious overvoltages, this method requires significant wafer processing that increases processing cost and time.

One application of the invention is in mixed-voltage bus designs. The standard operating voltages of ICs are decreasing in response to the desire to lower circuit power and increase circuit integration. The long-time standard voltage of 5 V has been largely replaced by 3.3 V. Circuits are currently being designed to operate at around 2.5 V and lower. As a result of this trend, system designers sometimes need to combine into one circuit ICs with different operating voltages. Therefore, it is desirable if these ICs can be directly connected to common buses.

An example of the application of the invention to a mixed-voltage system would be the case where a bus is shared by both 3.3 V and 5 V buffers. When the 5 V buffer has control of the bus, the 3.3 V buffers possessing the above overvoltage-tolerant scheme would prevent the flow of current from the 5 V power supply into the 3.3 V power supply and, thus, avoiding a degradation of the performance of the circuits and possible damage.

Figure 2:
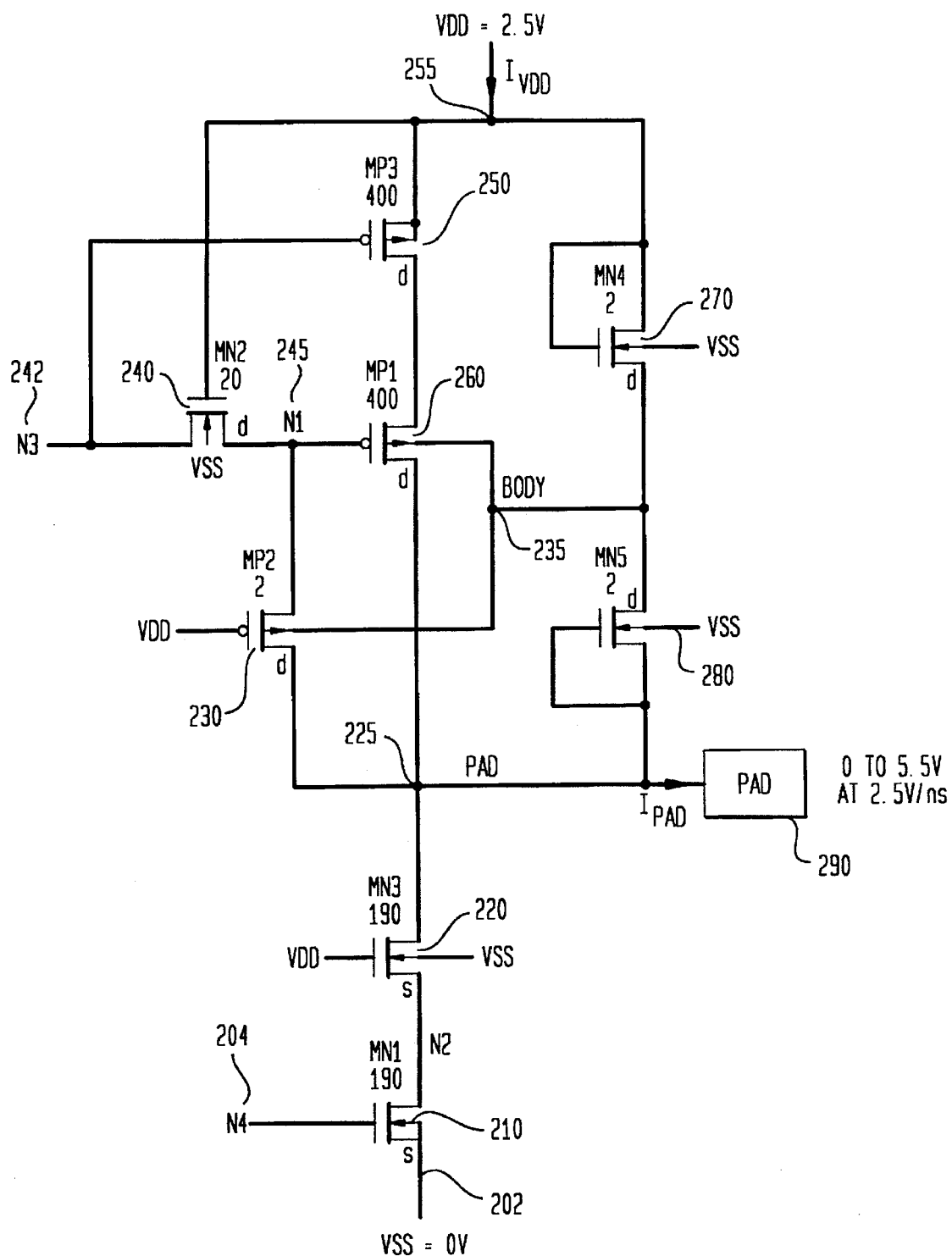
FIG. 2 is a circuit of the preferred embodiment of the invention showing an overvoltage-tolerant output buffer with self-biasing.

FIG. 2 illustrates a preferred embodiment of the invention. The circuit as shown in FIG. 2 includes a first p-channel FET 250 having a source and a body connected to a first voltage source 255, or VDD (approximately 2.5 V), a gate connected to a first input 242 (node N3), and a drain. A first n-channel FET 240 has a source connected to the first input 242, a body connected to a second voltage source 202, or VSS (approximately 0 V), a gate connected to the first voltage source 255, and a drain connected to a first node 245 (node N1). The circuit further includes a second p-channel FET 260 having a source connected to the drain of the first p-channel FET 250, a body connected to a second node 235 (node BODY), a gate connected to the first node 245, and a drain connected to a third node 225 (node PAD). A third p-channel FET 230 is provided having a source connected to the first node 245, a body connected to the second node 235, a gate connected to the first voltage source 255, and a drain connected to the third node 225. A second n-channel FET 220 has a drain connected to the third node 225, a body connected to the second voltage source 202, and a gate connected to the first voltage source 255. A third n-channel FET 210 is provided having a drain connected to the source of the second n-channel FET 220, a body and a source connected to the second voltage source 202, and a gate connected to a second input 204.

The circuit as shown in FIG. 2 also provides for a biasing-circuit for biasing the body of the second and the third p-channel FETs 260 and 230, respectively. The biasing-circuit contains a fourth n-channel FET 270 having a source and a gate connected to the first voltage source 255, a body connected to the second voltage source 202, and a drain connected to the second node 235. The biasing-circuit further includes a fifth n-channel FET 280 having a drain connected to the second node 235, a gate and a source connected to the third node 225, and a body connected to the second voltage source 202.

The two modes of operation in the preferred embodiment of the invention are now described. The first mode of operation is the enabled mode, and the second mode is the disabled mode, which is also known as the tri-state mode. In the enabled mode of operation, the inputs 242 and 204 are tied together. In the enabled mode, the circuit as shown in FIG. 2 operates as an output buffer to transfer signals applied to joined inputs, 204 and 242, to pad 290 by way of nMOS 240, pMOS 260, nMOS 210, and nMOS 220.

In the first scenario of the enabled mode of operation, inputs 242 and 204 are high. When the second input 204 is high, n-channel FET 210 is turned ON and thereby pulling its drain down to the second voltage source 202, or VSS (approximately 0 V). Since the drain of nMOS 210 is connected to the source of nMOS 220, whose gate is tied to the first voltage source 255, nMOS 220 is turned ON, thereby completing a conducting path from the second voltage source 202 to the pad 290. When the first input 242 is high, the voltage at the gate of p-channel FET 250 is high and thereby turning OFF p-channel FET 250. This essentially prevents the pad 290 from being pulled up to the first voltage source 255, or VDD, and, thus, allowing the pad 290 to be pulled down to the second voltage source 202, or VSS. The bodies of p-channel FETs 260 and 230 are tied to the second node 235. The voltage at the second node 235 is derived from the back-to-back diode arrangement produced by n-channel FETs 270 and 280.

As previously described, when the inputs 204 and 242 are high, the voltage at the pad 290 is approximately 0 V. The gate and source of nMOS 280 are connected to the pad 290. This results in nMOS 280 behaving like a reverse-biased diode because no current flows through nMOS 280. Because nMOS 280 is reverse-biased, the node 235 is effectively connected to the first voltage source 255 through nMOS 270, which behaves like a forward-biased diode. The result is that the body terminals of the pMOS 230 and 260 are biased at a potential approximately equal to the first voltage source 255, which is appropriate for the normal operation (no pad overvoltage) of the buffer. Also, because nMOS 280 is turned OFF, it acts to prevent the voltage at node 235 from influencing the voltage at the pad 290.

The second scenario in the enabled mode of operation is when the inputs 242 and 204 are low. When the second input 204 is low, the n-channel FET 210 is turned OFF and, therefore, the voltage from the pad 290 is not pulled down to the second voltage source 202, or VSS. When the first input 242 is low, the p-channel FET 250 is turned ON. Furthermore, since the first input 242 is low and the n-channel FET 240 acts as a pass-through (transferring) FET, the low signal is transferred from the first input 242 to the node 245.

Since both pMOS 250 and pMOS 260 are turned ON, and nMOS 210 is turned OFF, the node 225 and pad 290 are pulled up to the potential of the first voltage source 255. The drain of pMOS 230 is connected to node 225. As long as the voltage at the drain of pMOS 230 is less than or equal to the voltage at its gate, pMOS 230 is turned OFF.

In the disabled mode of operation of the output buffer, the second input 204 is low and the first input 242 is high. In other words, the second input 204 is tied to the second voltage source 202, or VSS, and the first input 242 is tied to the first voltage source 255, or VDD. When the second input 204 is low, it turns OFF the n-channel FET 210. When the first input 242 is high, it turns OFF the p-channel FET 250. This essentially decouples the internal circuitry connected to inputs 242 and 204 from the pad 290. Thus, control of the pad 290 and the external circuit connected to it is given up by the buffer, allowing the external circuit, typically a bus wire, to be used by external buffers.

In the first scenario of the disabled mode of operation, the voltage applied by the external buffers to the external circuit and, therefore, to pad 290 does not exceed the first voltage source 255, or VDD, the pMOS 260, pMOS 230, nMOS 220, and nMOS 280 all remain turned OFF. nMOS 270 remains turned ON, however, holding the node 235 at a potential approximately equal to the first voltage source, or VDD. Therefore, the potential at the bodies of the pMOS 260 and pMOS 230 also remain approximately equal to the first voltage source 255, or VDD.

Figure 3:
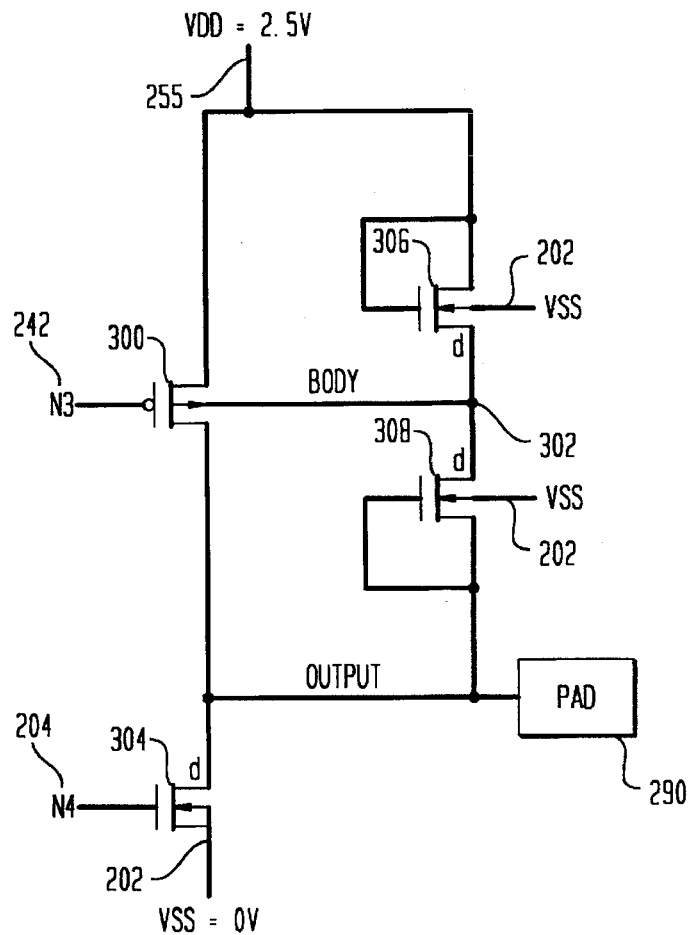
FIG. 3 is a circuit of a second embodiment of the invention.

FIG. 3 illustrates a second embodiment of the invention. The circuit includes a p-channel FET 300 having a body connected to a node 302, a source connected to a first voltage 255, a gate connected to a first input 242 and a drain connected to an output 290. A first n-channel FET 304 has a drain connected to the output 290, a gate connected to a second input 204, and a body and a source connected to a second voltage 202. The circuit further includes a second n-channel FET 306 having a source connected to the first voltage 255, a gate connected to the first voltage 255, a drain connected to node 302 and a body connected to the second voltage 202. A third n-channel FET 308 is also provided having a drain connected to node 302, a gate connected to the output 290, a source connected to the output 290 and a body connected to the second voltage 202. The second and third n-channel FETs comprise a biasing circuit for biasing the body of the p-channel FET so as to prevent forward biasing of the body.

In the second scenario of the disabled mode of operation, the voltage applied by the external buffers to the external circuit and, therefore, to pad 290 exceeds the first voltage source 255, or VDD. Since the source and gate of nMOS 280 are at a higher potential than the drain, nMOS 280 turns ON, operating like a forward-biased diode. This results in raising the voltage at note 235, and, therefore, raising the potential at the bodies of the pMOS 260 and pMOS 230 to a potential approximately equal to the overvoltage on the pad 290. Simultaneously, when the voltage at node 235 increases above the level of the first voltage source 255, or VDD, the nMOS 270 turns OFF, operating like a reverse-biased diode. This prevents the flow of current into the first voltage source 255, or VDD, which would disrupt the operation of the circuitry supplied by the first voltage source 255, or VDD, as well as the external circuitry.

While various operations of the invention have been described above, it should be understood that they have been presented by way of example only, and not limitation. Thus, the breadth and scope of the invention should not be limited by any of the above-described exemplary operations, but should be defined only in accordance with the following claims and their equivalents.

I claim:

1. An overvoltage-tolerant self-biasing input/output buffer circuit, comprising:

a p-channel field effect transistor having a body connected to a node, a source connected to a first voltage, a gate connected to a first input, and a drain connected to an output;

a first n-channel field effect transistor having a drain connected to said output, a gate connected to a second input, and a body and a source connected to a second voltage; and a biasing circuit for biasing said body of said p-channel field effect transistor so as to prevent forward-biasing of said body of said p-channel field effect transistor, said biasing circuit further comprising:

a second n-channel field effect transistor having a source connected to said first voltage, a gate connected to said first voltage, a drain connected to said node, and a body connected to said second voltage; and a third n-channel field effect transistor having a drain connected to said node, a gate connected to said output, a source connected to said output, and a body connected to said second voltage.

2. The overvoltage-tolerant self-biasing input/output buffer circuit of claim 1, wherein said first voltage is approximately 2.5 V.

3. The overvoltage-tolerant self-biasing input/output buffer circuit of claim 1, wherein said second voltage is approximately 0 V.

4. An overvoltage-tolerant self-biasing input/output buffer circuit, comprising:

a first p-channel field effect transistor having a source and a body connected to a first voltage, a gate connected to a first input, and a drain;

a first n-channel field effect transistor having a source connected to said first input, a body connected to a second voltage, a gate connected to said first voltage, and a drain connected to a first node;

a second p-channel field effect transistor having a source connected to the drain of said first p-channel transistor, a body connected to a second node; a gate connected to said first node, and a drain connected to an output;

a third p-channel field effect transistor having a source connected to said first node, a body connected to said second node, a gate connected to said first voltage, and a drain connected to said output;

a second n-channel field effect transistor having a drain connected to said output, a body connected to said second voltage, a gate connected to said first voltage, and a source;

a third n-channel field effect transistor having a drain connected to the source of said second n-channel field effect transistor, a body and a source connected to said second voltage, and a gate connected to a second input; and a biasing circuit for biasing said body of said second and said third p-channel field effect transistors, said biasing circuit further comprising:

a fourth n-channel field effect transistor having a source and a gate connected to said first voltage, a body connected to said second voltage, and a drain connected to said second node; and a fifth n-channel field effect transistor having a drain connected to said second node, a gate and a source connected to said output, and a body connected to said second voltage.

5. The overvoltage-tolerant self-biasing input/output buffer circuit of claim 4, wherein the voltage at said second node is substantially equal to the higher of said first voltage or the voltage at said output.

6. The overvoltage-tolerant self-biasing input/output buffer circuit of claim 4, wherein said first voltage is approximately 2.5 V.

7. The overvoltage-tolerant self-biasing input/output buffer circuit of claim 4, wherein said second voltage is approximately 0 V.

8. The overvoltage-tolerant self-biasing input/output buffer circuit of claim 4, wherein the voltage at said output approximately varies between 0 V and 5.5 V.

* * * * *